(12) United States Patent
Takao

(10) Patent No.: US 7,470,973 B2
(45) Date of Patent: Dec. 30, 2008

(54) SEMICONDUCTOR DEVICE AND SEMICONDUCTOR INTEGRATED CIRCUIT DEVICE

(75) Inventor: Yoshihiro Takao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/411,888

(22) Filed: Apr. 27, 2006

(65) Prior Publication Data

US 2006/0197161 A1 Sep. 7, 2006

Related U.S. Application Data

(63) Continuation of application No. PCT/JP03/16782, filed on Dec. 25, 2003.

(51) Int. Cl.
*H01L 29/04* (2006.01)

(52) U.S. Cl. .................... 257/627; 257/628

(58) Field of Classification Search ................ 257/627, 257/E29.297, 628
See application file for complete search history.

(56) References Cited

U.S. PATENT DOCUMENTS

| | | | |
|---|---|---|---|
| 6,656,853 B2 | 12/2003 | Shinya | |
| 6,882,025 B2* | 4/2005 | Yeo et al. .................... | 257/510 |
| 6,982,465 B2 | 1/2006 | Yukihiro et al. | |
| 7,193,269 B2 | 3/2007 | Toda et al. | |
| 2002/0063292 A1* | 5/2002 | Armstrong et al. .......... | 257/367 |
| 2002/0081794 A1 | 6/2002 | Ito | |
| 2003/0181005 A1* | 9/2003 | Hachimine et al. .......... | 438/231 |

FOREIGN PATENT DOCUMENTS

| | | |
|---|---|---|
| JP | 58-162027 | 9/1983 |
| JP | 64-48462 | 2/1989 |
| JP | 2002-198368 A | 7/2002 |
| JP | 2003-86708 A | 3/2003 |
| JP | 2003-179157 A | 6/2003 |
| JP | 2003-197906 | 7/2003 |
| JP | 2003-273206 | 9/2003 |
| WO | WO 03/050871 A1 | 6/2003 |

OTHER PUBLICATIONS

Shinya Ito et al., "Mechanical Stress Effect of Etch-Stop Nitride and its Impact on Deep Submicron Transistor Design", IDEM 2000, Technical Digest, pp. 247-250.
Hirokazu Sayama et al., "Effect of <100> channel direction for high-performance short-channel-effect immune MOSFET", Oyo Buturi, vol. 69, No. 9, pp. 1099-1102 (2000).
International Search Report of International Application PCT/JP2003/016782 mailed Mar. 9, 2004.
Japanese Office Action dated Sep. 16, 2008, issued in corresponding Japanese Application No. 2005-512797.

* cited by examiner

*Primary Examiner*—Douglas M Menz
(74) *Attorney, Agent, or Firm*—Westerman, Hattori, Daniels & Adrian, LLP.

(57) ABSTRACT

In each of a p-channel MOS transistor and an n-channel MOS transistor, a channel direction is set in the <100> direction and a first stressor film accumulating therein a tensile stress is formed in a STI device isolation structure. Further, a second stressor film accumulating therein a tensile stress is formed on a silicon substrate so as to cover the device isolation structure.

11 Claims, 20 Drawing Sheets

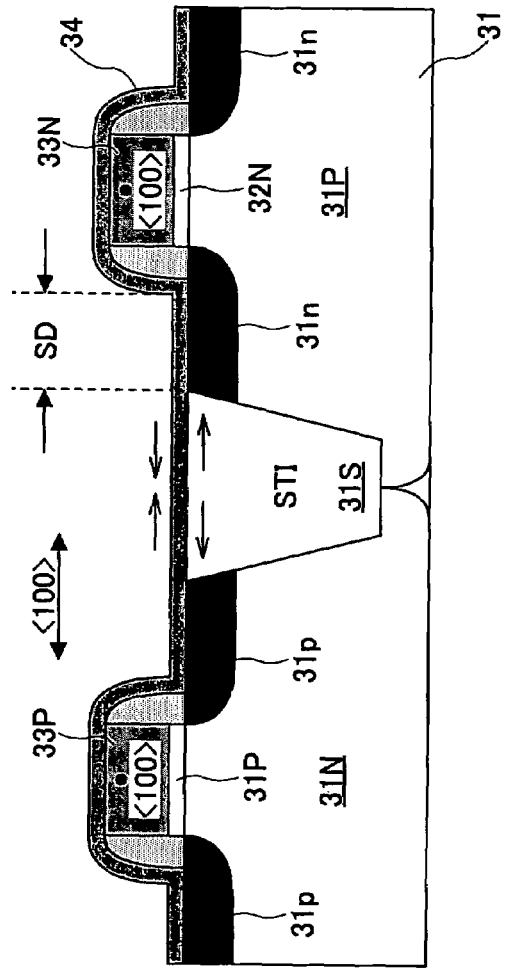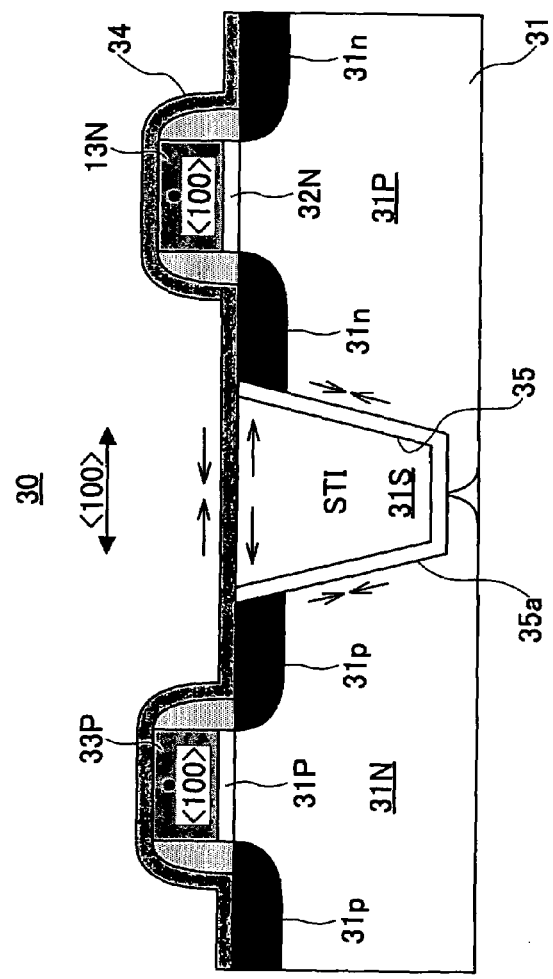
FIG.8A
FIG.8B

FIG.11

| CHANNEL ORIENTATION | TENSILE FILM 15 or 35 | TENSILE FILM 14 or 34 | NMOS CHARACTERISTIC | VARIATIONS (SD WIDTH) | PMOS CHARACTERISTIC | VARIATIONS (SD WIDTH) |
|---|---|---|---|---|---|---|
| <110> | NO | NO | × | × | × | × |
| <110> | NO | YES | ○ | × | ×× | × |
| <110> | YES | YES | ○ | ○ | ×× | × |
| <100> | NO | NO | × | × | ○ | × |
| <100> | NO | YES | ○ | ×× | △ | ○ |
| <100> | YES | YES | ○ | ○ | ○ | ○ |

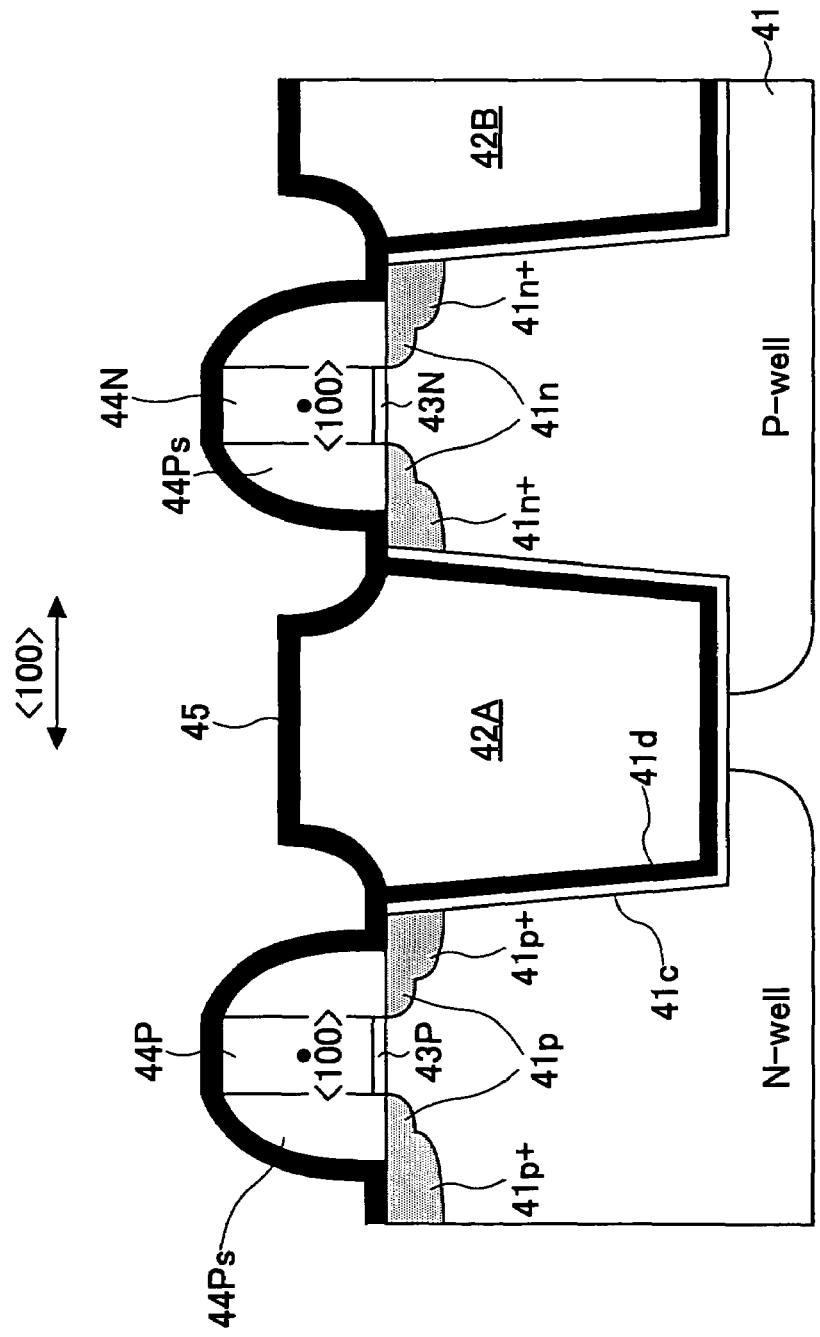

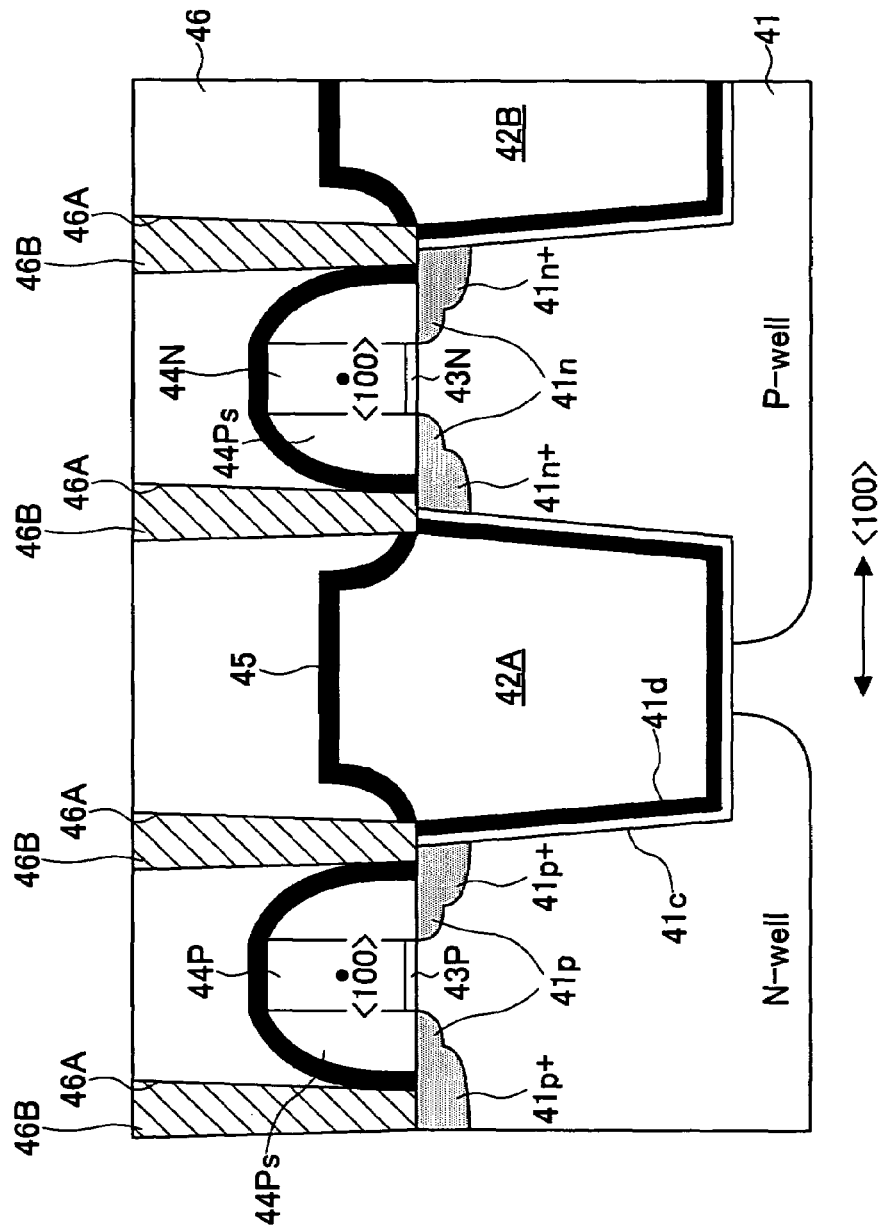

US 7,470,973 B2

SEMICONDUCTOR DEVICE AND SEMICONDUCTOR INTEGRATED CIRCUIT DEVICE

CROSS-REFERENCE TO RELATED APPLICATION

The present invention is a continuation application filed under 35 U.S.C. 111(a) claiming benefit under 35 U.S.C. 120 and 365(c) of PCT application JP2003/16782 filed on Dec. 25, 2003, the entire contents of each are incorporated herein as reference.

BACKGROUND OF THE INVENTION

The present invention generally relates to semiconductor devices and more particularly to a ultra-fast semiconductor device including a CMOS circuit.

A CMOS circuit is a fundamental device element of high-speed logic circuits and is used in various ultra-fast processors of these days.

A CMOS circuit has a construction of connecting a p-channel MOS transistor and an n-channel MOS transistor in series, and thus, it is necessary that both the p-channel MOS transistor and the n-channel MOS transistor operate at high speed for realizing the desired high-speed operation of the CMOS circuit.

In ultra-fast semiconductor devices of these days, the p-channel MOS transistor and n-channel MOS transistor constituting the CMOS circuit are both subjected to miniaturization to have a gate length of 0.1 µm or less. In fact, MOS transistors having the gate length of 90 nm or 50 nm are already fabricated.

With the semiconductor integrated circuit device that includes such ultra-miniaturized transistors, it is generally practiced in the art to use a so-called STI (shallow trench isolation) structure for device isolation, wherein an STI structure is formed by a process of forming a device isolation trench in a silicon substrate, followed by filling the device isolation trench by a silicon oxide film.

FIG. 1 shows the construction of a typical conventional CMOS device 10 that uses an STI structure.

Referring to FIG. 1, there is formed an n-type well 11N and a p-type well 11P in a silicon substrate 11 having a (100) surface orientation by an STI structure 11S respectively as the device region of the p-channel MOS transistor and the device region of the n-channel MOS transistor, wherein there is formed a gate electrode 13P on the surface of the silicon substrate 11 in the region of the n-type well 11N in correspondence to a channel of the p-channel MOS transistor via a gate oxide film 12P, such that the gate electrode 13P extends in the <110> direction. Further, there are formed a pair of p-type diffusion regions 11p constituting the p-channel MOS transistor in the n-type well 11N at respective sides of the gate electrode 13P.

Similarly, there is formed a gate electrode 13N on the surface of the silicon substrate 11 in the region of the p-type well 11P in correspondence to a channel region of the n-channel MOS transistor via a gate oxide film 12N, such that the gate electrode 13N extends in the <110> direction. Further, there are formed a pair of n-type diffusion regions 11n constituting the n-channel MOS transistor in the p-type well 11P at respective sides of the gate electrode 13N.

SUMMARY OF THE INVENTION

FIGS. 2A and 2B show the relationship between the direction of gate electrode formed on a silicon substrate of a (100) surface orientation and the cleavage direction of the silicon substrate, wherein FIG. 2A shows the case in which the orientation flat is provided by a (110) surface and the gate electrode extends in the <110> direction, while FIG. 2B shows the case in which the orientation flat is provided by a (100) surface and the gate electrode extends in the <100> direction.

As will be explained later, the gate electrode orientation of FIG. 2A is used commonly in the conventional semiconductor devices including the construction shown in FIG. 1 in view of the specific relationship between the dicing line and the cleavage direction of the silicon substrate.

Meanwhile, when forming such an STI structure, it is practiced in the art to fill the device isolation trench with a silicon oxide film by way of a CVD process, while a silicon oxide film formed by a CVD process generally contains a large amount of defects or impurities in the state immediately after deposition. Further, such a CVD silicon oxide film has a low film density in the state immediately after deposition. Thus, the silicon oxide film of such as-deposited state has poor etching durability and it is not possible to achieve effective device isolation.

Thus, it is practiced in the art of STI device isolation structure to apply a thermal annealing process to the silicon oxide film filling the device isolation trench at a temperature of about 1000° C. for about 30 seconds and convert the low-quality silicon oxide film of the as-deposited state to a high-quality silicon oxide film.

On the other hand, with such thermal annealing process, the silicon oxide film 11S filling the device isolation trench causes dilatation as shown by the arrows in FIG. 1 as a result of such a thermal annealing process, and the n-type well 11N or the p-type well 11P constituting the device region adjacent to the STI structure is subjected to a compressive stress.

As long as the MOS transistor is the conventional one and the degree of device miniaturization is moderate, there is a sufficient distance between the channel region underneath the gate electrode where the carriers are transported at high speed and the device isolation structure, and the magnitude of the stress acting upon the channel region is relatively small. Thus, in the conventional MOS transistors, change of band structure of the Si crystal constituting the channel region with the compressive stress applied thereto and associated problem of decrease of the carrier mobility have not been a serious problem in view of the fact that there have been caused little degradation in the device performance with such a stress.

However, with ultra-high speed MOS transistors of these days having the gate length of 0.1 µm or less, there is a need of decreasing a source-drain width ("SD" in FIG. 1) for the part between the device isolation structure 11S and the gate electrode 13P or 13N in view of the need of realizing high-speed operation by way of decreasing the source resistance and decreasing the junction capacitance for the diffusion regions 11p and 11n. In FIG. 1, it should be noted that the source-drain width SD is defined as the distance between the edge of the device isolation structure 11S and the sidewall insulation film of the gate electrode 13N, while this source-drain width SD is substantially equal to the distance between the edge of the device isolation structure and the corresponding edge of the gate electrode 13N in view of the small thickness of the sidewall insulation film.

When the source-drain width SD is thus decreased, on the other hand, there arises a problem in that the device isolation structure 11S comes too close to the channel region and the channel region is subjected to a large compressive stress. When such a large compressive stress is applied to the channel region, there are caused various influences with regard to the operational characteristics of the p-channel and n-channel transistors.

In order to compensate for such influences of the compressive stress caused by the device isolation structure 11S, there is a proposal of a CMOS device 20 shown in FIG. 3 that uses a stress compensation film or "stressor film". In FIG. 3, it should be noted that those parts corresponding to the parts described previously are designated by the same reference numerals and the description thereof will be omitted.

Referring to FIG. 3, the CMOS device 20 has a construction similar to that of the CMOS device 10 of FIG. 1, except that there is formed a stressor film 14 typically of silicon nitride on the silicon substrate 11 by a CVD process such that the stressor film 14 accumulates therein a tensile stress, wherein the stressor film 14 is formed so as to cover the substrate surface continuously including the gate electrodes 13P and 13N.

FIG. 4 shows the ON/OFF current of the n-channel MOS transistor for the case in which such a stressor film 14 is provided and for the case in which the stressor film 14 is not provided.

Referring to FIG. 4, it can be seen that the operational characteristics is improved for the n-channel MOS transistor with the formation of the stressor film 14 as demonstrated by the remarkable decrease of the OFF current.

REFERENCES

PATENT REFERENCE 1
  Japanese Laid-Open Patent Application 58-162027
PATENT REFERENCE 2
  U.S. Pat. No. 5,729,045
PATENT REFERENCE 3
  Japanese Laid-Open Patent Application 2003-273206
NON-PATENT REFERENCE 1
  Ito, S., et al., IEDM2000, Technical Digest, pp. 247-pp. 250
NON-PATENT REFERENCE 2
  Sayama, et al., OYO BUTURI, vol. 69, No. 9, 2000, pp. 1099-1102.

FIG. 5 shows the relationship between the source-drain width (hereinafter designated as "SD width") and the source-drain current Ids obtained for the conventional p-channel MOS transistor and n-channel MOS transistor constituting the CMOS circuit of FIG. 3 for the case such a stressor film 14 is provided, wherein it should be noted that, in FIG. 5, any of the p-channel and n-channel MOS transistors has the channel orientation, in other words the direction in which the carriers are transported through the channel region, is set to be coincident to the <110> direction. It should be noted that this channel orientation is chosen generally in the art for avoiding occurrence of cracking at the time of dicing of a silicon wafer into individual chips after formation of device structures on such a silicon wafer, by coinciding the direction of dicing with the extending direction of the cleavage surface. Reference should be made to FIG. 2A explained before with regard to the crystal orientation including the cleaving direction.

In FIG. 5, it should be noted that the horizontal axis represents the SD width represented in terms of microns, while the vertical axis represents the source-drain current Ids normalized by a reference source-drain current Ids0 defined for the case the source-drain width SD is set to 5 μm.

Referring to FIG. 5, there is little difference in the normalized source-drain current Ids/Ids0 between the n-channel MOS transistor and the p-channel MOS transistor when the SD width is set to be 5 μm, while when the SD width is decreased to be equal to or smaller than 1 μm, there occurs a remarkable decrease in the normalized source/drain current Ids/Ids0 for the n-channel MOS transistor and increase for the p-channel MOS transistor. It should be noted that such decrease of the source-drain current Ids in the n-channel MOS transistor reflects the decrease of carrier mobility in the channel region thereof, and hence the decrease of operational speed of the n-channel MOS transistor, while such decrease of the operational speed of the n-channel MOS transistor result in a decrease of overall operational speed of the CMOS circuit.

Further, while the relationship of FIG. 5, which indicates an increase of the normalized source-drain current Ids/Ids0 with decrease of the SD width with regard to the p-channel MOS transistor, may seem to be preferable for the p-channel MOS transistor, a CMOS circuit includes both a p-channel MOS transistor and an n-channel MOS transistor, and there is caused a degradation in the overall operational characteristics for the CMOS circuit with such a construction because of the decrease of the carrier mobility in the n-channel MOS transistor.

Further, because a single integrated circuit device includes transistors of various SD widths, in other words various device sizes as shown in FIG. 5 by arrows, such a variation of the operational characteristics of the p-channel and n-channel MOS transistors with the SD width as in the case of FIG. 5 is recognized as the variation of operational characteristics of individual transistors at the time of designing of the semiconductor integrated circuit. Thereby, there is caused a problem that designing of the semiconductor integrated circuit becomes difficult. It should be noted that such a problem did not come up with the conventional transistor having the SD width of 5 μm larger, as will be understood from the relationship of FIG. 5.

FIG. 6 shows the relationship between the compressive stress and the degree of conductivity change for a p-channel MOS transistor and an n-channel MOS transistor that constitute the CMOS circuit 20 of FIG. 3, wherein it should be noted that the compressive stress is applied perpendicularly to the channel direction, and hence perpendicular to the direction of carrier transport in the channel region.

Referring to FIG. 6, it can be seen that the conductivity of the n-channel MOS transistor decreases slightly with the compressive stress, while in the case of the p-channel MOS transistor, the conductivity decreases significantly with the compressive stress. It should be noted that this conductivity corresponds to the mobility of the carriers in the channel region, and the relationship of FIG. 6 implies that the operational characteristics of the p-channel and n-channel MOS transistors change differently with the compressive stress applied to the channel region.

FIG. 7, on the other hand, shows the relationship between the compressive stress and the change rate of the conductivity for the case the compressive stress is applied parallel to the channel direction and hence parallel to the direction in which the carriers are transported through the channel region.

Referring to FIG. 7, the conductivity of the n-channel MOS transistor decreases with the compressive stress also in the case the compressive stress is applied parallel to the channel region, while in the case of the p-channel MOS transistor, it can be seen that the trend of the conductivity change with the compressive stress is reversed and the conductivity of the p-channel MOS transistor increases with the compressive stress. As explained previously, the conductivity corresponds to the carrier mobility in the channel, and thus, the relationship of FIG. 7 implies that the operational characteristics of the p-channel and n-channel MOS transistors change differently with the compressive stress applied to the channel region.

As explained before, the magnitude of the compressive stress applied to the channel region changes with the SD width, and hence the size of the transistor, and thus, the compressive stress applied to the channel region increases with decreasing SD width, and hence with increasing degree of device miniaturization.

Thus, in the case the semiconductor integrated circuit device includes transistors of various different sizes, the transistors provide different operational characteristics, while such difference of the device characteristics is recognized as the variation of the transistor characteristics at the time of designing of the semiconductor integrated circuit device.

Accordingly, it is a general object of the present invention to provide a novel and useful semiconductor device wherein the foregoing problems are eliminated.

Another and more specific object of the present invention is to provide a semiconductor device wherein the change of operational characteristics induced by the stress applied to the channel region is compensated for any of the p-channel MOS transistor and the n-channel MOS transistor.

Another object of the present invention is to provide a semiconductor device comprising:

a silicon substrate of a (100) surface orientation;

a device isolation structure formed in said silicon substrate so as to define a first device region and a second device region in said silicon substrate;

an n-channel MOS transistor formed in said first device region of said silicon substrate; and a p-channel MOS transistor formed in said second device region of said silicon substrate, said n-channel MOS transistor comprising a first gate electrode extending over said silicon substrate via a first gate insulation film in said first device region in a <100> direction of said silicon substrate and a pair of n-type diffusion regions formed in said silicon substrate in said first region at respective lateral sides of said first gate electrode, said p-channel MOS transistor comprising a second gate electrode extending over said silicon substrate via a second gate insulation film in said second device region in a <100> direction of said silicon substrate and a pair of p-type diffusion regions formed in said silicon substrate in said second region at respective lateral sides of said second gate electrode, a first stressor film accumulating therein a tensile stress being formed over said silicon substrate so as to cover at least said device isolation structure, said device isolation structure comprising a device isolation trench formed in said silicon substrate and a device isolation insulator filling said device isolation trench, a second stressor film accumulating therein a tensile stress being formed over a surface of said device isolation trench such that said second stressor film is interposed between said silicon substrate and said device isolation insulator.

Another object of the present invention is to provide a semiconductor device comprising a silicon substrate having a (100) surface orientation, and plural semiconductor elements formed over said silicon substrate, said plurality of semiconductor elements comprising plural p-channel MOS transistors and plural n-channel MOS transistors, said plural p-channel MOS transistors being formed in respective device regions formed in said silicon substrate by a device isolation structure with respective, mutually different areas, each of said plural p-channel MOS transistors comprising a gate electrode extending in a <100> direction of said silicon substrate and a pair of p-type diffusion regions formed in said device region of said p-channel MOS transistor at respective lateral sides of said gate electrode of said p-channel MOS transistor, said plural n-channel MOS transistors being formed in respective device regions formed in said silicon substrate by said device isolation structure with respective, mutually different areas, each of said plural n-channel MOS transistors comprising a gate electrode extending in a <100> direction of said silicon substrate and a pair of p-type diffusion regions formed in said device region of said n-channel MOS transistor at respective lateral sides of said gate electrode of said n-channel MOS transistor, each of said plural p-channel MOS transistors and n-channel MOS transistors being covered by a first stressor film accumulating therein a tensile stress, said device isolation structure comprising a device isolation trench formed in said silicon substrate so as to surround said device regions of said p-channel MOS transistors and said device regions of said n-channel MOS transistors, and a device isolation insulator filing said device isolation trench, a second stressor film accumulating therein a tensile stress being formed on a surface of said device isolation trench between said device isolation insulator and said silicon substrate.

According to the present invention, it becomes possible to substantially eliminate the dependence of operational characteristics on the compressive stress for the p-channel MOS transistors, by setting the gate electrode orientation in the <100> direction. Further, according to the present invention, it becomes possible to substantially eliminate the dependence of operational characteristics upon the compressive stress for n-channel MOS transistors, by forming the first and second stressor films respectively on the surface of the silicon substrate and the surface of the device isolation trench of the STI (shallow trench isolation) structure.

According to the present invention, it becomes possible to eliminate the effect of the compressive stress, caused by the device isolation structure, upon the operational characteristics of the device substantially for any of the p-channel MOS transistors and the n-channel MOS transistors, and the variation of the device characteristics induced by the difference of the device area is successfully eliminated in the semiconductor integrated circuit device, in which a large number of semiconductor elements of different device areas are integrated on a silicon substrate. Thereby, it becomes possible to carry out the designing of the semiconductor integrated circuit by using a circuit simulator, even in the case the individual semiconductor elements in the semiconductor integrated circuit device are miniaturized.

Other objects and further features of the present invention will become apparent from the following detailed description when read in conjunction with the attached drawings.

BRIEF DESCRIPTION OF THE DRAWINGS

FIGS. 8A and 8B are diagrams explaining the principle of the present invention;

FIG. 11 is a diagram showing the effect of the present invention in comparison with other various constructions;

FIGS. 12A-12K are diagrams showing the fabrication process of the semiconductor device according to a first embodiment of the present invention;

DETAILED DESCRIPTION OF THE INVENTION

[Principle]

Figure 1:
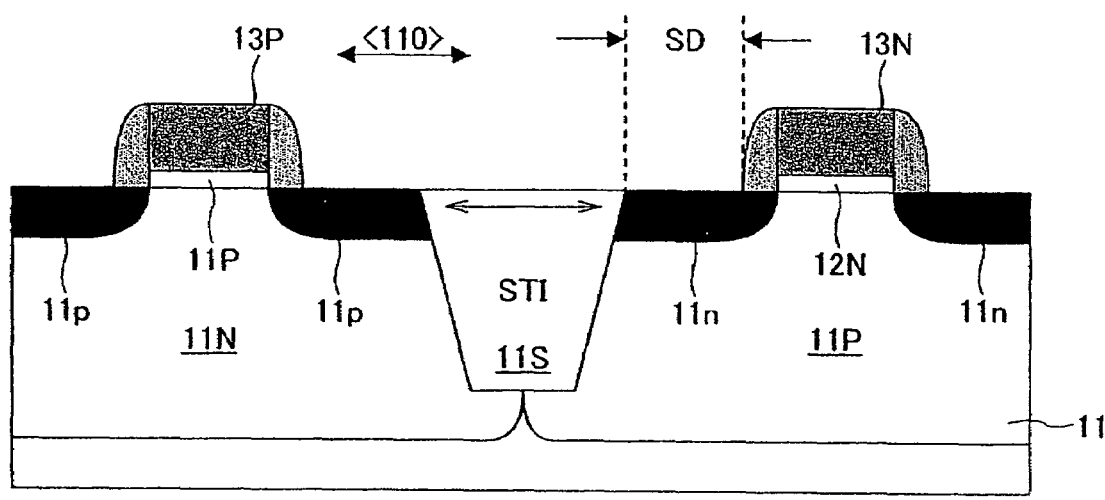
FIG. 1 is a diagram showing the construction of a conventional semiconductor device.
Figure 2A:
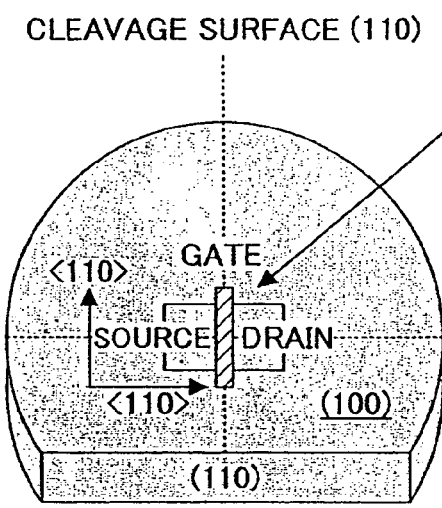
FIGS. 2A and 2B are diagrams defining the crystal orientations on a silicon substrate.
Figure 2B:
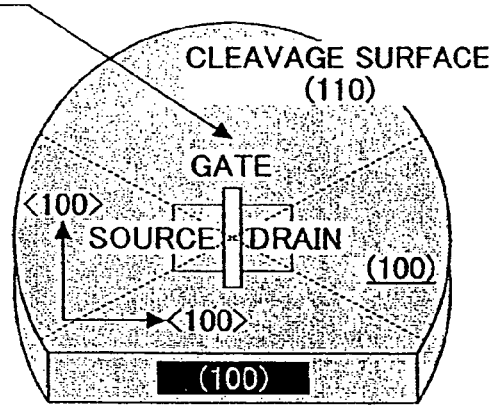

FIGS. 8A and 8B are diagrams showing the principle of the present invention.

Referring to FIG. 8A first, a silicon substrate 31 of a (100) surface orientation includes an STI structure 31S such that the STI structure 31S defines an n-type well 31N and a p-type well 31P respectively as the device region of the p-channel MOS transistor and the n-channel MOS transistor. Further, a gate electrode 33P is formed on the silicon substrate 31 via a gate oxide film 32P in the region of the n-type well 31N such that the gate electrode 33P extends over the silicon substrate 31 in the <100> direction. Further, a pair of p-type diffusion regions 31p of the p-channel MOS transistor are formed in the n-type well 31N at respective lateral ends of the gate electrode 33P.

Similarly, there is formed a gate electrode 33N on the silicon substrate 31 via a gate oxide film 32N in the region of the p-type well 31P such that the gate electrode 33N extends over the silicon substrate 31 in the <100> direction. Further, a pair of n-type diffusion regions 31n of the n-channel MOS transistor are formed in the p-type well 31n at respective lateral ends of the gate electrode 33N.

Further, with the construction of FIG. 8A, there is formed a stressor film 34 accumulating therein a tensile stress on the silicon substrate 31 so as to cover the substrate surface continuously including the gate electrodes 33P and 33N, wherein the stressor film 34 is typically formed of a silicon nitride film deposited by a pyrolitic CVD process.

Figure 3:
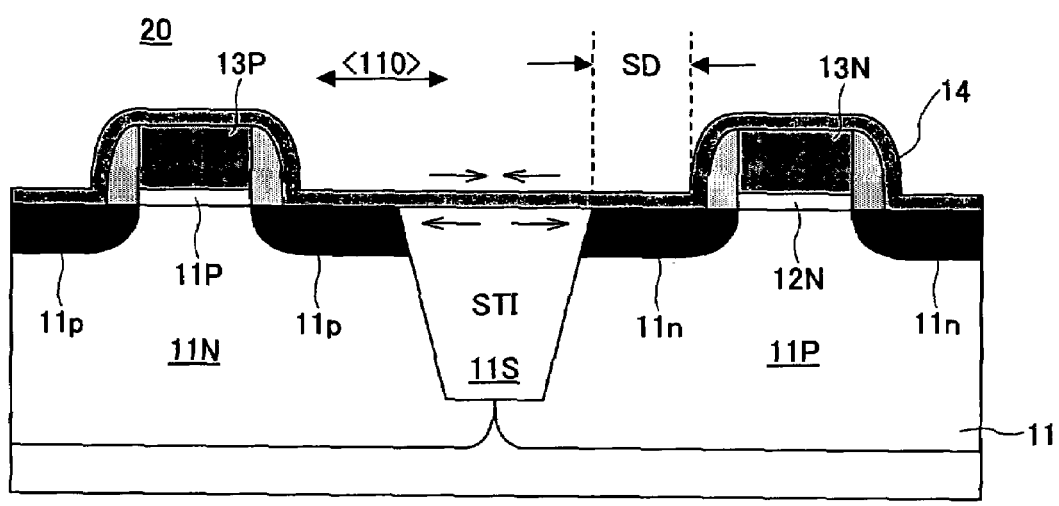
FIG. 3 is a diagram showing the construction of another conventional semiconductor device.

Thus, the construction of FIG. 8A corresponds to the construction of the semiconductor device 20 of FIG. 3, except that the extending direction of the gate electrodes 13P and 13BN, and hence the direction of transport of the carries in the respective channels, is changed form the conventional <110> direction to the <100> direction.

Figure 9:
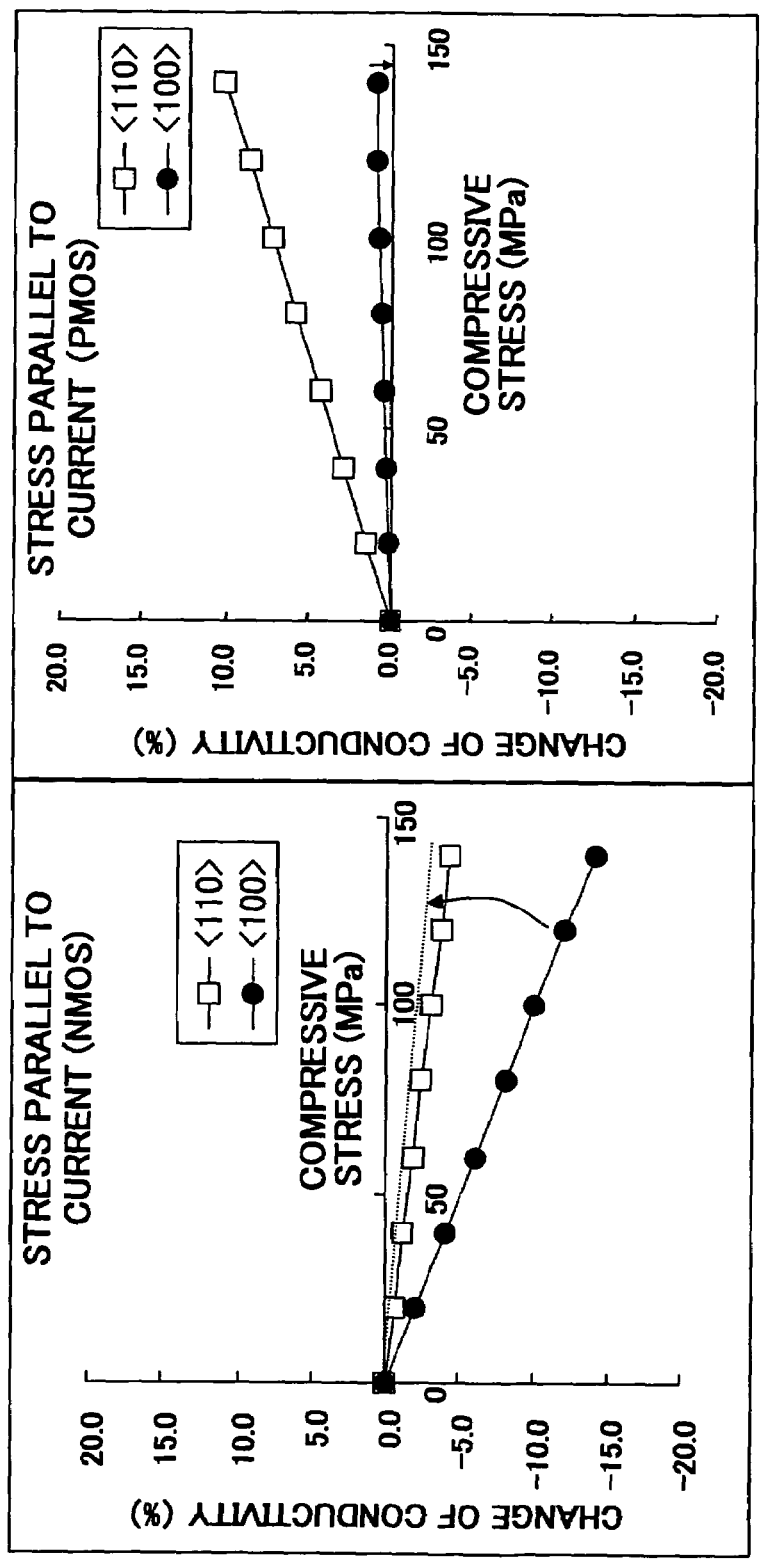
FIG. 9 is another diagram explaining the principle of the present invention.

FIG. 9 is a diagram showing the relationship between the compressive stress working parallel to the channel direction and the channel conductivity for the case the extending direction of the gate electrodes 33P and 33N is set in the <100> direction, in comparison with the case in which the extending direction of the gate electrodes 13P and 13N are set in the <110> direction as shown in FIG. 3. In FIG. 9, it should be noted that □ represents the case in which the gate electrodes 13P and 13N are extending in the <110> direction, while ● represents the present invention in which the gate electrodes 33P and 33N are extending in the <100> direction.

Referring to FIG. 9, it can be seen that the dependence of the conductivity of the p-channel MOS transistor, and hence the dependence of the carrier mobility thereof in the channel region, upon the compressive stress can be reduced to substantially zero by setting the extending direction of the gate electrodes 13P and 13N to be coincident to the <100> direction of the silicon substrate 11.

On the other hand, with regard to the n-channel MOS transistor, it can be seen that the dependence of the conductivity upon the compressive stress is increased with such a construction and there occurs a decrease in the conductivity with compressive stress for such an n-channel MOS transistor.

Because such dependence of conductivity upon the compressive stress in the n-channel MOS transistor is recognized as a variation of characteristics of the semiconductor devices on the substrate at the time of designing of the semiconductor integrated circuit device as note already, the present invention suppress such variation of characteristics of the n-channel MOS transistors with the construction of FIG. 8B, which is a modification of the construction of FIG. 8A.

Referring to FIG. 8B, there is formed a tensile stressor film 35 on the surface of the device isolation trench constituting the device isolation structure 31S such that the tensile stressor film 35 accumulates therein a tensile stress. Typically, a silicon nitride film is formed for the tensile stressor film 35 by a low-pressure CVD (LPCVD) process so as to accumulate therein the tensile stress, wherein the tensile stressor film 35 is formed via a thin silicon oxide film 35a, and the silicon oxide film constituting the device isolation insulator is formed on the tensile stressor film 35.

With such a construction, the compressive stress, caused by the dilatation of the device isolation insulator, is effectively cancelled out by the tensile stressor film 35, and the dependence of the conductivity upon the compressive stress is reduced to substantially zero for the case of the p-channel MOS transistor as represented in FIG. 9 by an arrow. Further, in the case of the n-channel MOS transistor, too, the dependence of the conductivity upon the compressive stress is reduced significantly as shown in FIG. 9 by an arrow and a dotted line.

Referring to FIG. 9, it can be seen that the proportion of the change of the conductivity is reduced to 1% or less with the construction of FIG. 8B when a compressive stress of 150 MPa is applied to a p-channel MOS transistor, while in the case the same compressive stress of 150 MPa is applied to the n-channel MOS transistor, the proportion of the change of conductivity is reduced to 3% or less.

Further, it should be noted that such a tensile stressor film 35 does not affect on the operational characteristics of the p-channel MOS transistor, as the operational characteristics of the p-channel MOS transistor is substantially immune to the compressive stress as shown in FIG. 9.

Figure 10:
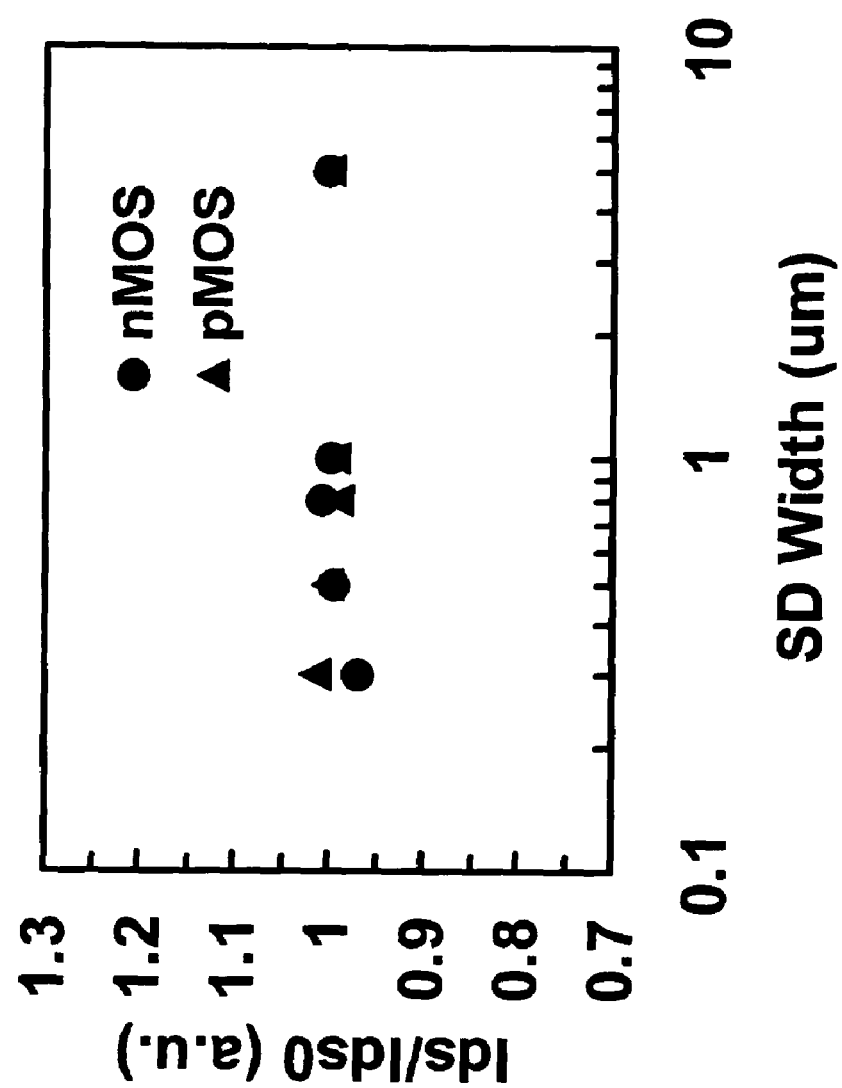
FIG. 10 is a diagram showing the effect of the present invention.

FIG. 10 shows the normalized source-drain current Ids/Id0 of the p-channel and n-channel MOS transistors in the semiconductor device 30 of FIG. 8B for the case the gate length, and hence the source-drain width SD, thereof is changed variously.

Figure 5:
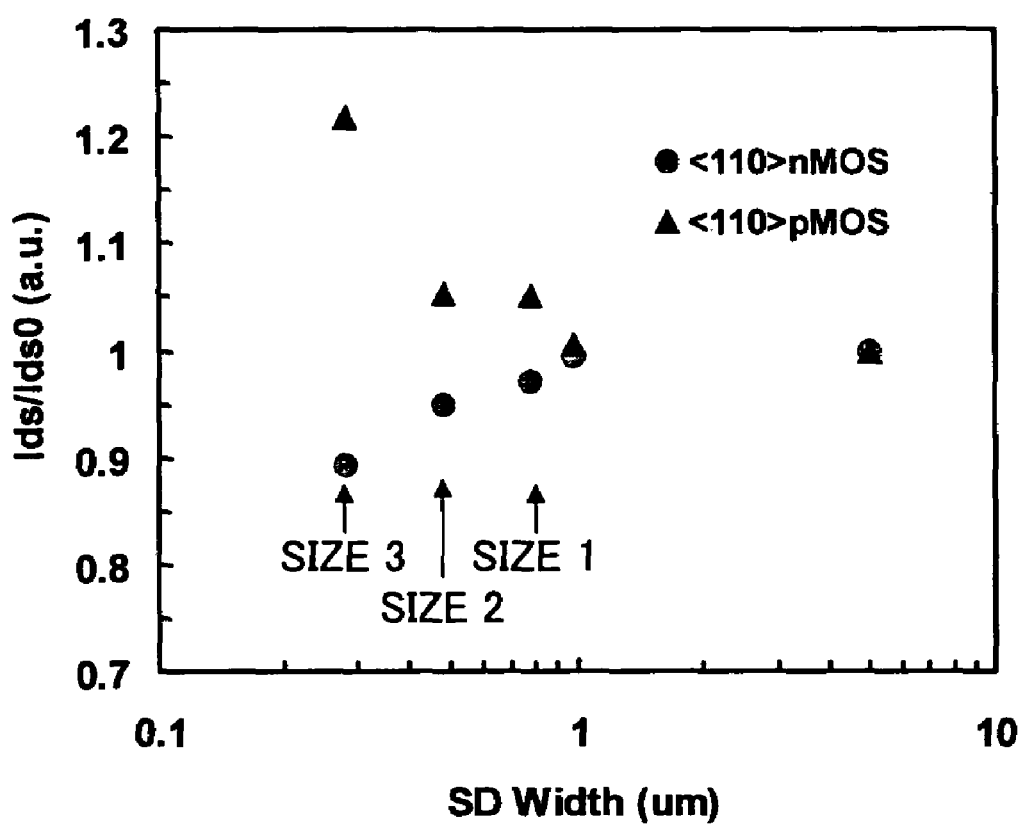
FIG. 5 is a diagram showing the relationship between the source-drain current and transistor size for the conventional n-channel and p-channel MOS transistors having the channel region in the <110> direction.
Figure 6:
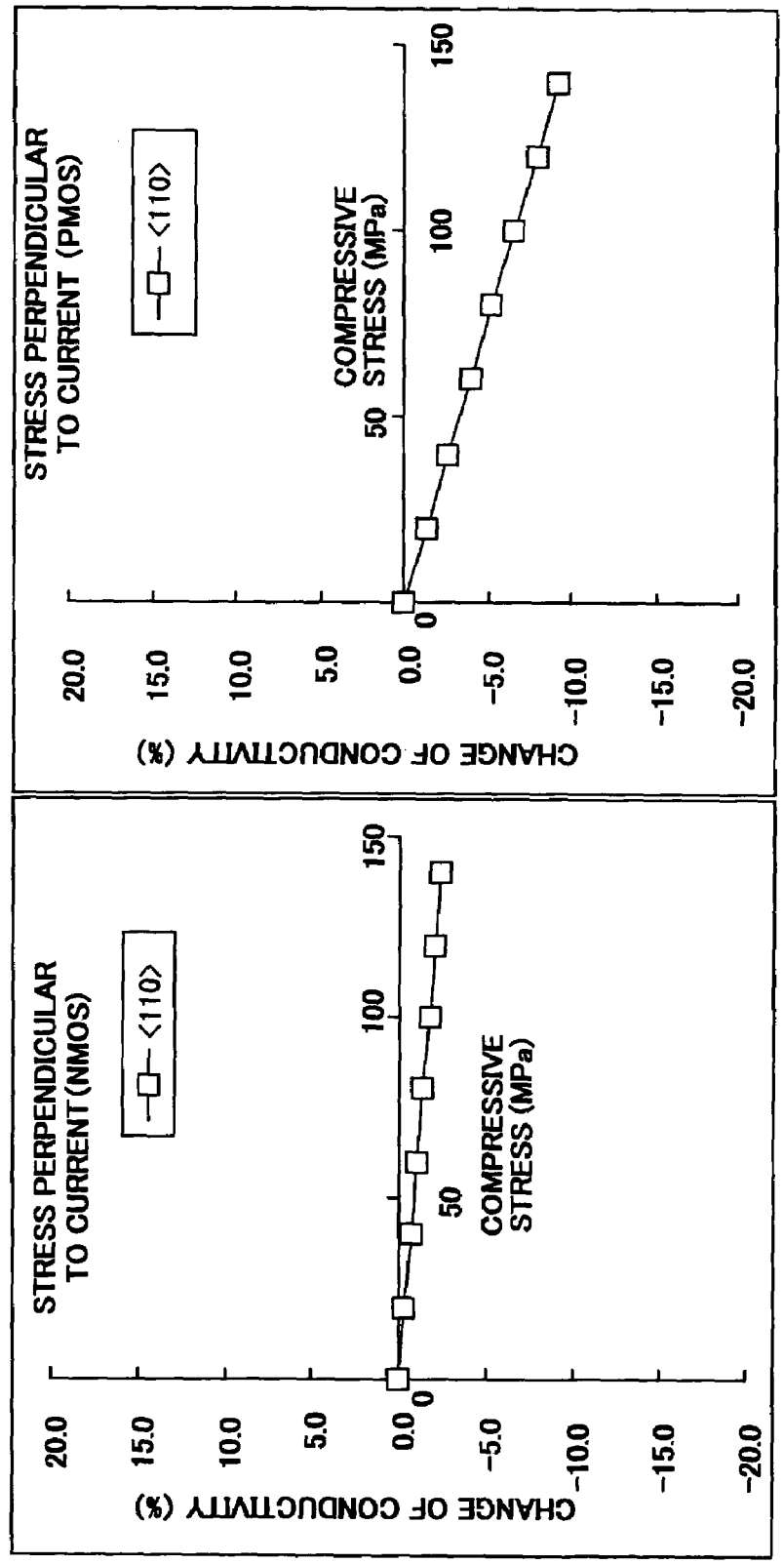
FIG. 6 is a diagram showing the relationship between the compressive stress and the conductivity for the conventional semiconductor device.
Figure 7:
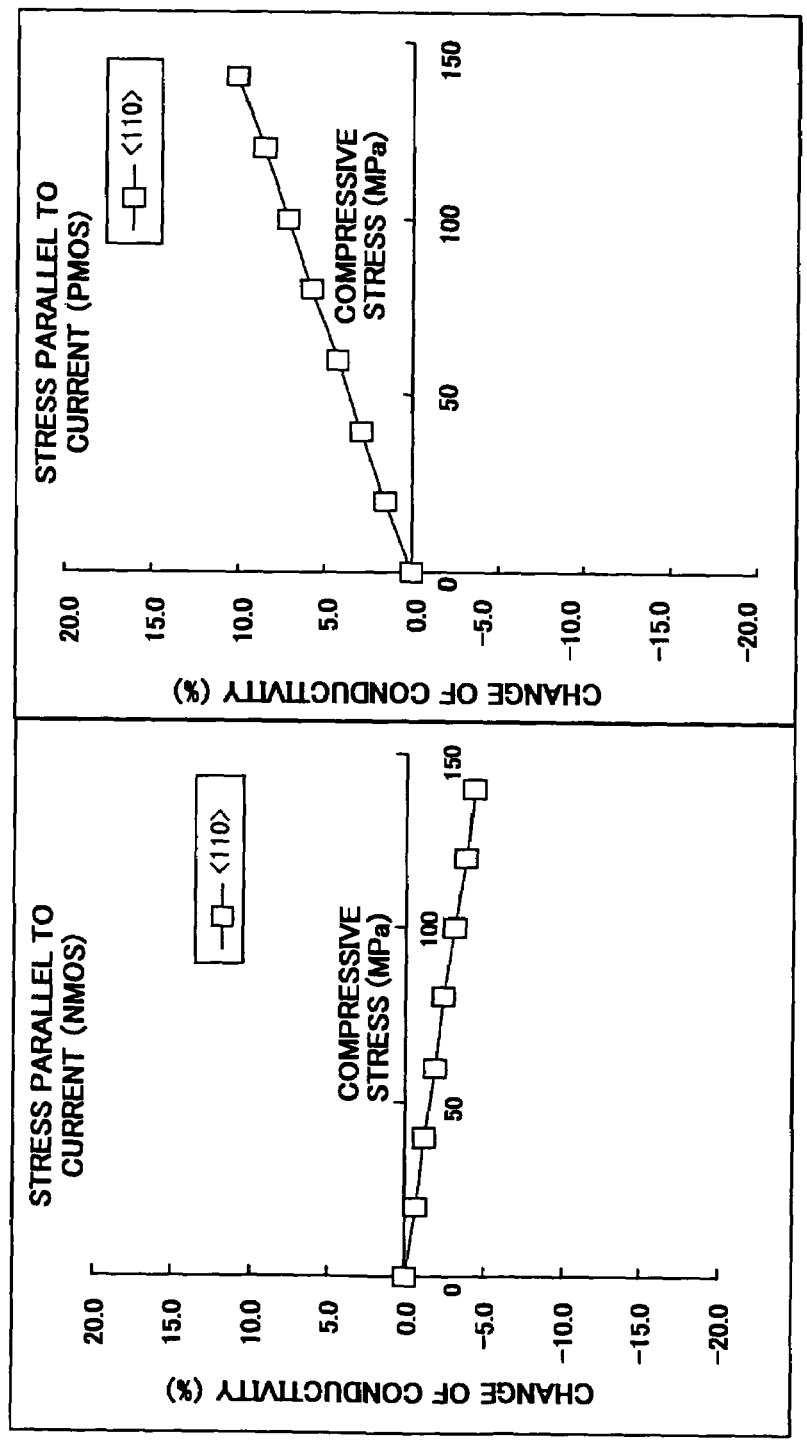
FIG. 7 is another diagram showing the relationship between the compressive stress and conductivity for the conventional semiconductor device.

Comparing FIG. 10 with FIG. 5 explained before, it can be seen that the dependence of the normalized source-drain current Ids/Ids0 upon the source-drain width SD is substantially eliminated not only in the p-channel MOS transistors but also in the n-channel MOS transistors, even in the case the SD width is reduced to 0.3 μm.

FIG. 11 summarizes the relationship between the ON/Off current characteristics (transistor characteristics) and the variation of the characteristics caused by the SD width (Variation (SD width)) for the constructions of FIGS. 1, 3 and FIGS. 8A and 8B, for two settings of the channel orientation and hence the extending direction of the gate electrodes 13P and 13N or 33P and 33N for the case the tensile stressor films 14 and 15 or 34 and 35 are provided and for the case one or both of the tensile stressor films 14 and 15 or 34 and 35 are not provided.

Referring to FIG. 11, it can be seen that no satisfactory transistor characteristics or no satisfactory SD width dependence thereof is obtained for any of the n-channel MOS transistors and the p-channel MOS transistors as long as the channel orientation, and hence the extending direction of the gate electrodes 13P and 13N, is set to the <110> direction and when any of the stressor films 14 and 15 are not provided as in the case of FIG. 1.

Figure 4:
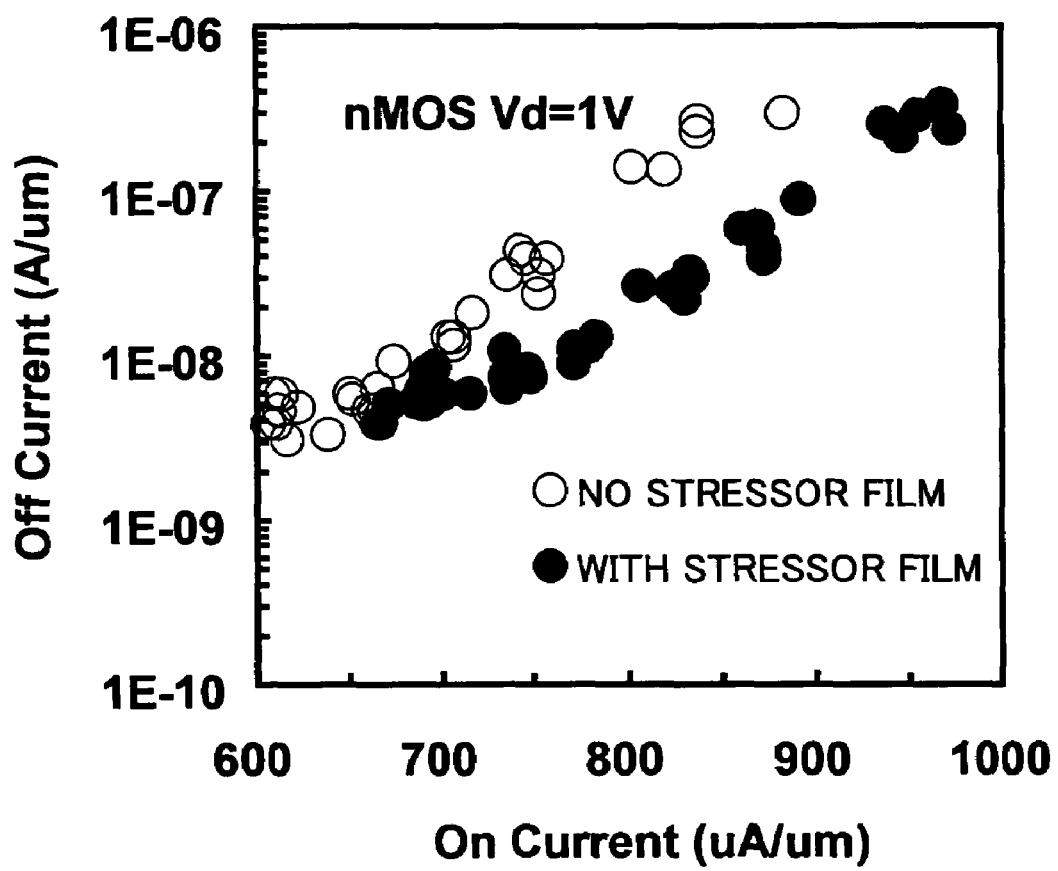
FIG. 4 is a diagram comparing the characteristics of the semiconductor devices of FIGS. 1 and 2.

When the stressor film 14 alone is provided while using the same <110> direction for the extending direction of the gate electrodes 13P and 13N as in the case of FIG. 3, it can be seen that the transistor characteristics is improved for the n-channel MOS transistors as already explained with reference to FIG. 4. However, there is observed no improvement with regard to other items. In particular, it is observed that the transistor characteristics are degraded for the p-channel MOS transistors with such a construction.

Further, in the case both the stressor films 14 and 15 are provided in combination with the <110> direction of the gate electrodes 13P and 13N, there is certainly achieved an improvement with regard to the transistor characteristics and further the SD-width dependence thereof as far as the n-channel MOS transistors are concerned, while it should be noted that there is caused a degradation in the transistor characteristics for the p-channel MOS transistors with such a construction. Further, no improvement is achieved with regard to the SD-width dependence of the transistor characteristics for the p-channel MOS transistors.

In the case the extending direction of the gate electrodes 33P and 33N is set to the <100> direction while not providing the stressor films 34 and 35, there is achieved satisfactory transistor characteristics for the p-channel MOS transistors while no improvement is observed for other items.

Further, in the case the extending direction of the gate electrodes 33P and 33N is set to the <100> direction in combination with the use of the stressor film 34 alone, it can be seen that there are achieved satisfactory transistor characteristics and excellent SD-width dependence thereof for the p-channel MOS transistors in correspondence to the situation of FIG. 9, while it is noted that there is caused a degradation in the SD-width dependence of the transistor characteristics for the n-channel MOS transistors.

Further, in the case the extending direction is set to the <100> direction for the gate electrodes 33P and 33n and the stressor films 34 and 35 are provided as explained with reference to FIG. 8B, it can be seen that satisfactory results is obtained for all of the items.

As explained already with reference to FIG. 9, the problem of deterioration of conductivity of the n-channel MOS transistor is caused for the case a compressive stress is applied to the channel region thereof in the direction in which the carriers are transported through the channel, and hence parallel to the channel direction. Thus, it is important that the stressor films 34 and 35 are capable of causing a tensile stress in the channel direction with the construction of FIG. 8B. Further, it is important that the stressor film 34 formed on the silicon substrate 31 covers the device isolation structure 31S, which functions as the source of the compressive stress.

FIRST EMBODIMENT

FIGS. 12A-12K show the fabrication process of a CMOS device according to a first embodiment of the present invention.

Figure 12A:
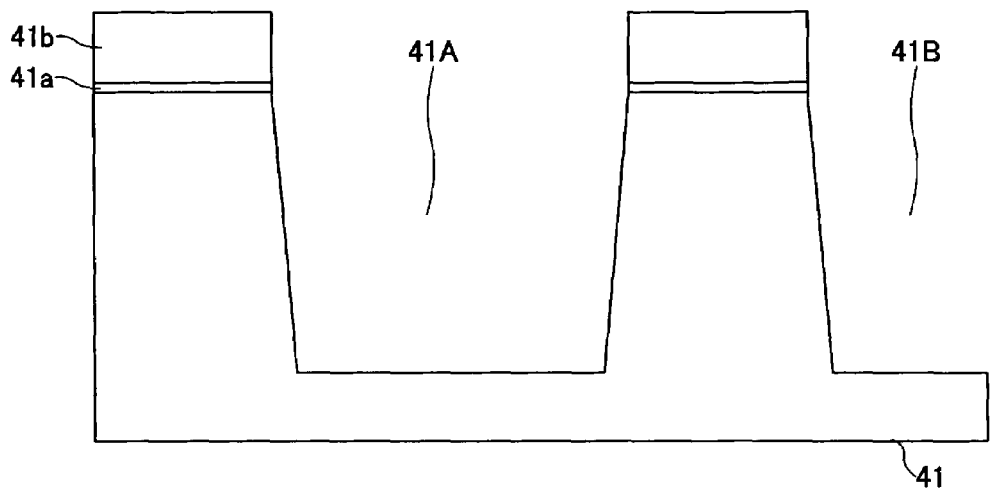

Referring to FIG. 12A, a silicon nitride pattern 41b is formed on a silicon substrate 41 of a (100) surface orientation with a thickness of about 100 nm via a silicon oxide film 41a, and device isolation trenches 41A and 41B are formed in the silicon substrate 41 with a depth of about 300 nm and a width of 100-400 nm by applying a dry etching process to the silicon substrate 41 while using the silicon nitride pattern 41b as a mask.

Figure 12B:
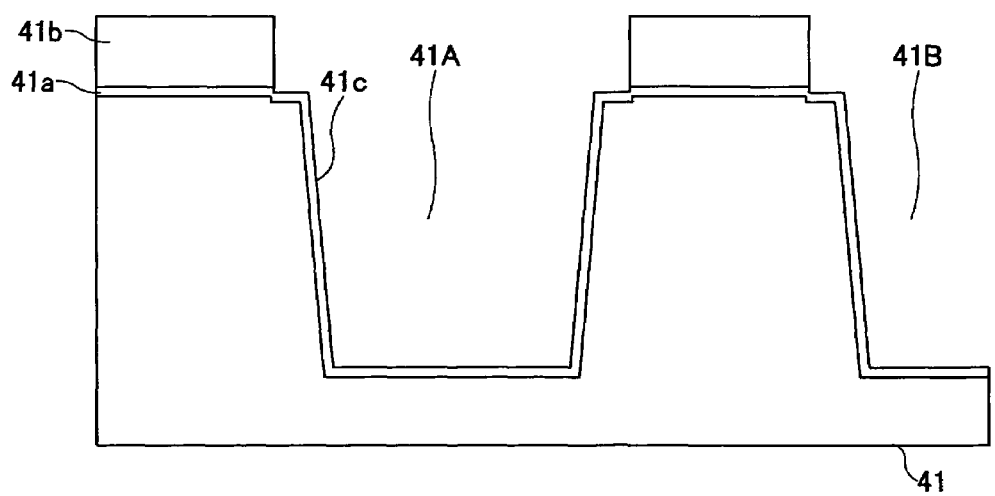

Next, in the step of FIG. 12B, the silicon substrate 41 is subjected to a thermal oxidation processing while using the silicon nitride pattern 41b as a mask. With this, the surface of the device isolation trenches 41A and 41B is recovered from the damages caused by the dry etching process. Further, as a result of this thermal oxidation processing, there is formed a thermal oxide film 41c on the surface of the device isolation trenches 41A and 41B with the thickness of about 5 nm.

Figure 12C:
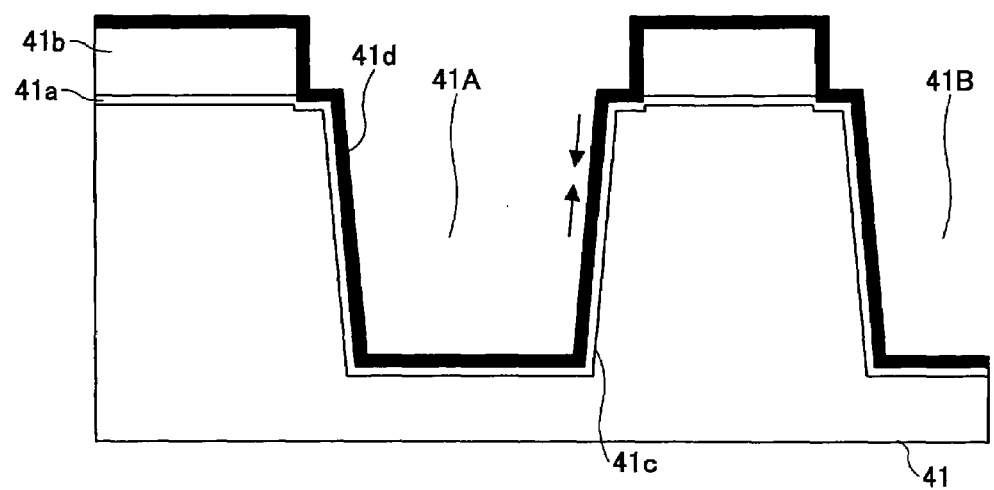

Next, in the step of FIG. 12C, a silicon nitride film 41d is formed on the structure of FIG. 12B by an LPCVD (low-pressure CVD) process with the thickness of about 10 nm. It should be noted that the formation of the silicon nitride film 41d is conducted by supplying a mixed gas of $SiCl_2H_2$ and $NH_3$ as the source gas at the substrate temperature of typically 600° C., wherein it is known that the silicon nitride film formed under such a condition accumulates a strong tensile stress therein as represented in the drawing by arrows.

Figure 12D:
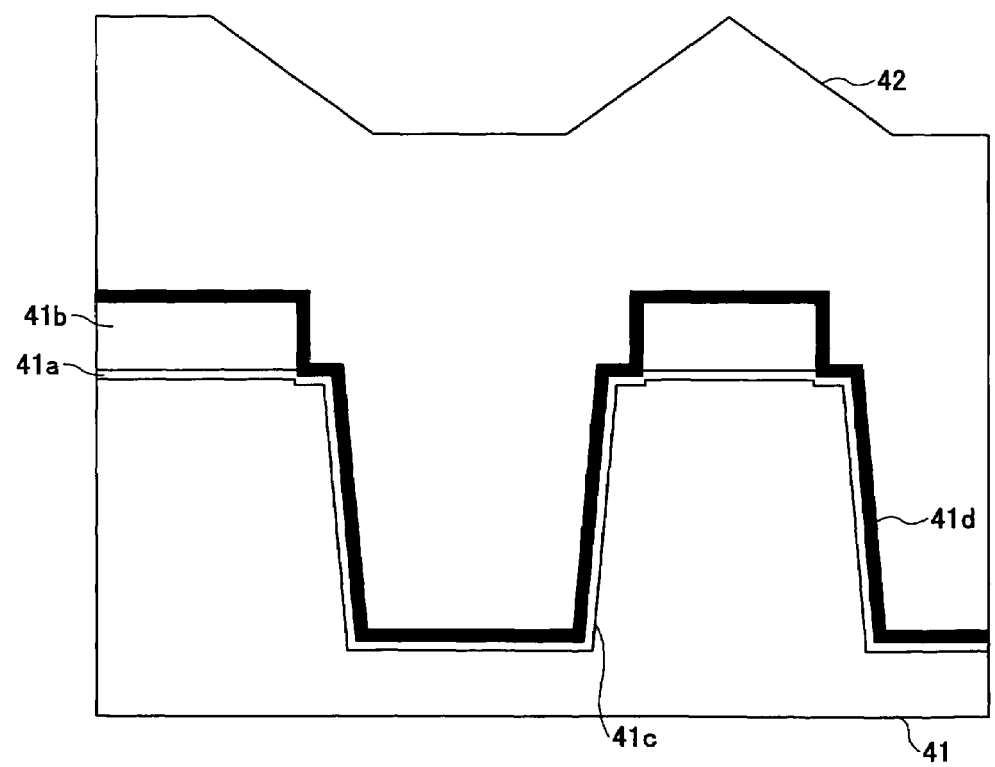

Next, in the step of FIG. 12D, a silicon oxide film 42 is formed on the structure of FIG. 12C by a pyrolytic CVD process, or the like, so as to fill the device isolation trenches 41A and 41B, wherein the silicon oxide film 42 is polished out by a chemical mechanical polishing (CMP) process while using the silicon nitride pattern 41b as a stopper. With this, a silicon oxide film 42A is formed so as to fill the device isolation trench 41A, and a silicon oxide film 41B is formed so as to fill the device isolation trench 41B.

Figure 12E:
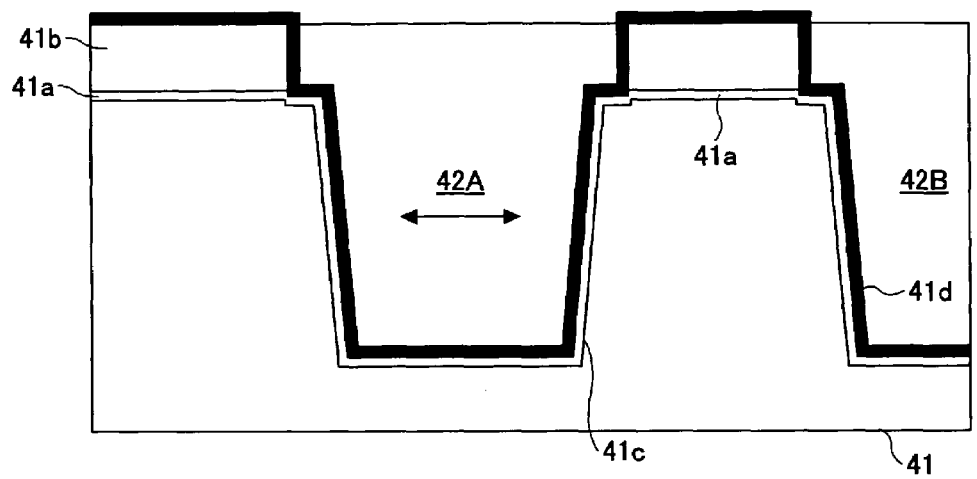

Next, in the step of FIG. 12E, the silicon oxide films 42A and 42B are converted to a dense and high-quality silicon oxide film by subjecting to a thermal annealing process conducted at the temperature of 1000° C. for 30 seconds.

Figure 12F:
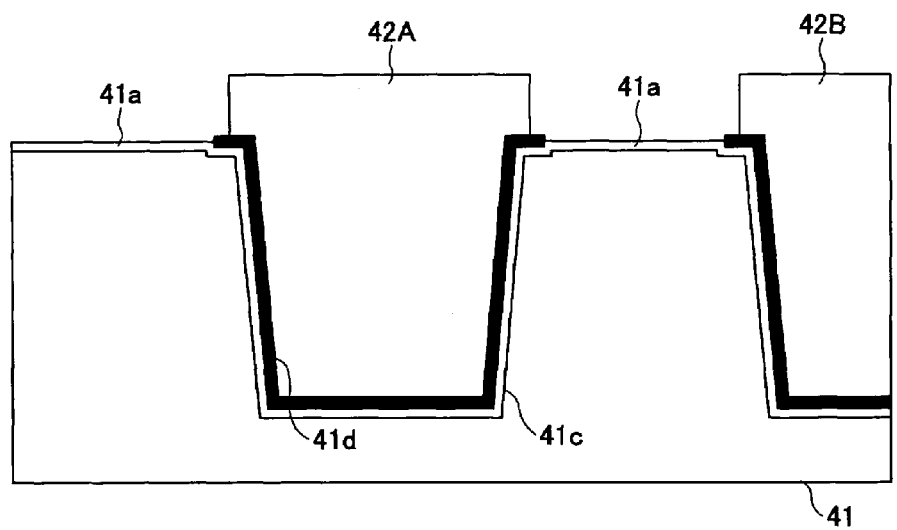
Figure 12G:
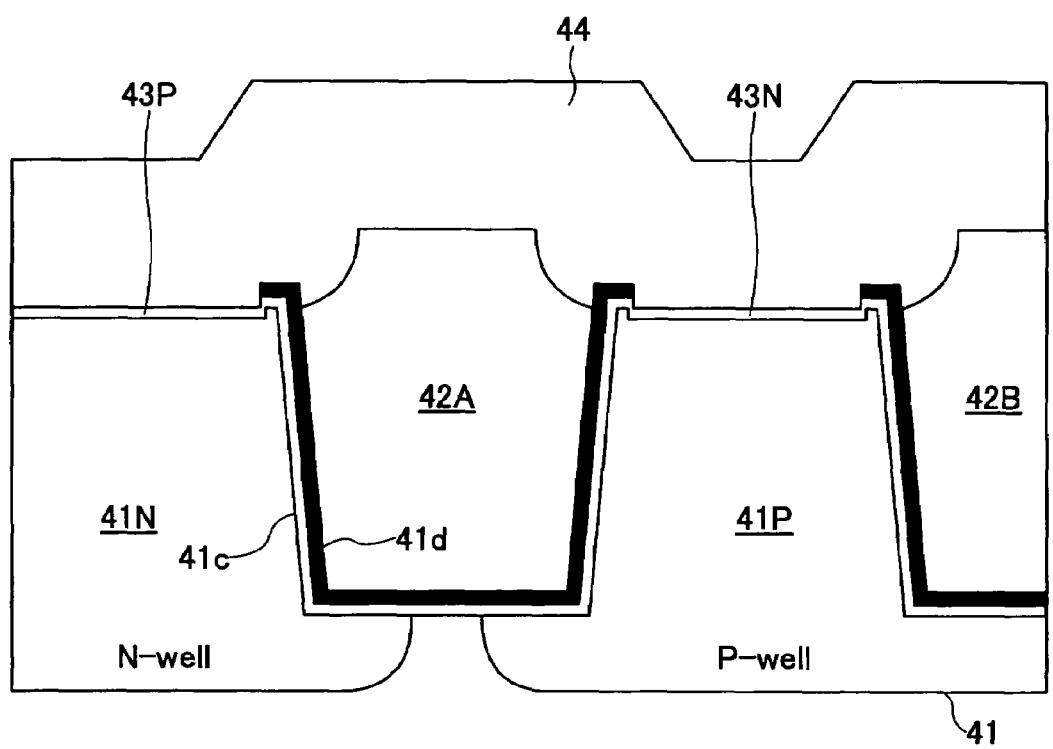

Next, in the step of FIG. 12F, the silicon nitride film pattern 41b is removed by a pyrophosphoric acid treatment, and an n-type well 41P is formed in the silicon substrate 41 in the step of FIG. 12G as the device region of an n-channel MOS transistor by introducing B+ into the silicon substrate 41 by an ion implantation process conducted selectively while using a mask process, wherein the ion implantation of B+ may be conducted under the acceleration voltage of 150 keV with the dose of $3 \times 10^{13}$ $cm^{-2}$. Further, in the step of FIG. 12G, an n-type well 41N is formed in the silicon substrate 41 as the device region of a p-channel MOS transistor by introducing P+ into the silicon substrate 41 by an ion implantation process conducted selectively while using a mask process, wherein the ion implantation of P+ may be conducted under the acceleration voltage of 300 keV with the dose of $3 \times 10^{13}$ $cm^{-2}$.

Further, in the step of FIG. 12G, channel doping is made in the surface part of the p-type well 41P by selectively introducing B+ by an ion implantation process conducted under the acceleration voltage of 10 keV with the dose of $8\times10^{12}$ cm$^{-2}$. Similarly, in the step of FIG. 12G, channel doping is made in the surface part of the n-type well 41N by selectively introducing As+ by an ion implantation process conducted under the acceleration voltage of 100 keV with the dose of $8\times10^{12}$ cm$^{-2}$.

Further, in the step of FIG. 12G, the oxide film covering the silicon substrate 41 is removed by an HF treatment, and a silicon oxide film or a silicon nitride film is formed newly on the surface of the device region 41N as a gate insulation film 43P of the p-channel MOS transistor. At the same time, a similar gate insulation film 43N is formed on the surface of the device region n41P as the gate insulation film 43N of the n-channel MOS transistor.

Further, in the step of FIG. 12G, a polysilicon film 44 is deposited uniformly on the silicon substrate 41 thus formed with the gate insulation films 43P and 43N.

Figure 12H:
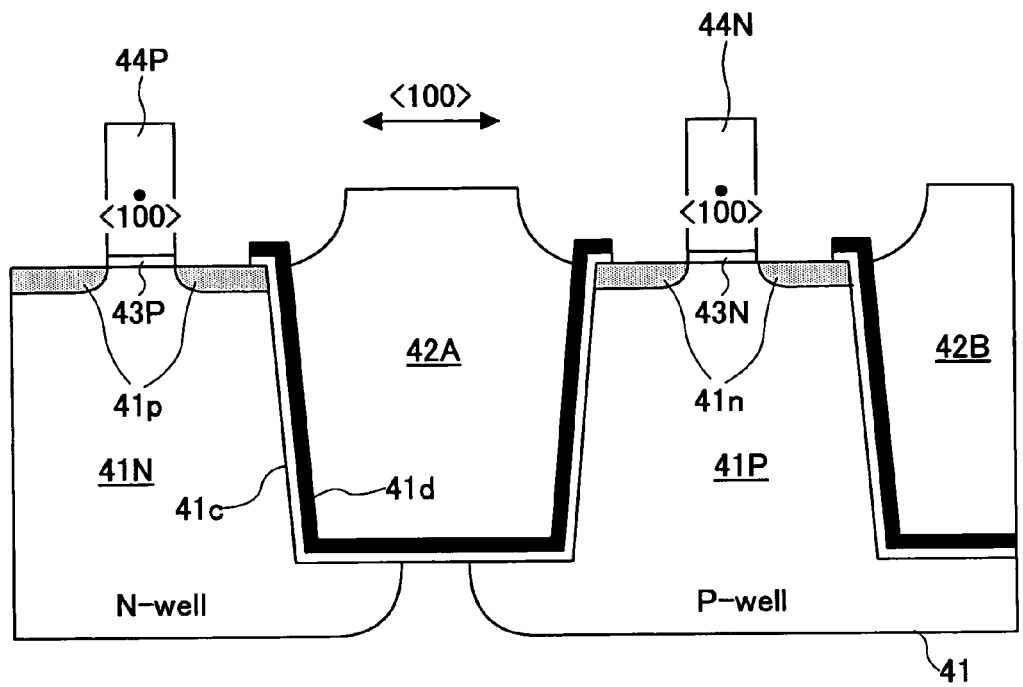

Next, in the step of FIG. 12H, the polysilicon film 44 is subjected to a patterning process, and with this, a gate electrode 44P is formed on the gate insulation film 43P in the device region 41N and a gate electrode 44N is formed on the gate insulation film 43N in the device region 41P. Thereby, the present invention forms the gate electrodes 44P and 44N so as to extend in the <100> direction of the silicon substrate 41.

Next, in the step of FIG. 12H, B+ is introduced into the device region 41N by an ion implantation process conducted under the acceleration voltage of 0.5 keV with the dose of $1\times10^{15}$ cm$^{-2}$ while using the gate electrode 44P as a mask, and with this, LDD regions 41p of p$^-$-type are formed in the device region 41N at respective lateral side of the gate electrode 44P. Further, in the step of FIG. 12H, As+ is introduced into the device region 41P by an ion implantation process conducted under the acceleration voltage of 3 keV with the dose of $1\times10^{15}$ cm$^{-2}$ while using the gate electrode 44N as a mask, and with this, LDD regions 41n of n$^-$-type are formed in the device region 41P at respective lateral side of the gate electrode 44N. Thereby, it should be noted that, at the time of the ion implantation into the device region 41N, the device region 41P is covered by a resist pattern (not illustrated), while at the time of the ion implantation into the device region 41P, the device region 41N is covered by a resist pattern (not illustrated). Further, at the time of formation of the LDD region 41p, the gate electrode 44P is doped to the p$^-$-type, while at the time of formation of the LDD region 41n, the gate electrode 44N is doped to the n$^-$-type Next, in the step of FIG. 12I, a silicon oxide film is deposited on the structure of FIG. 12H by a CVD process. Further, by applying an etch-back process to the silicon oxide film thus deposited, sidewall insulation films 44Ps are formed on the respective sidewall surfaces of the gate electrode 44P. Further, sidewall insulation films 44Ns are formed on the respective sidewall surfaces of the gate electrode 44N at the same time.

Figure 12I:
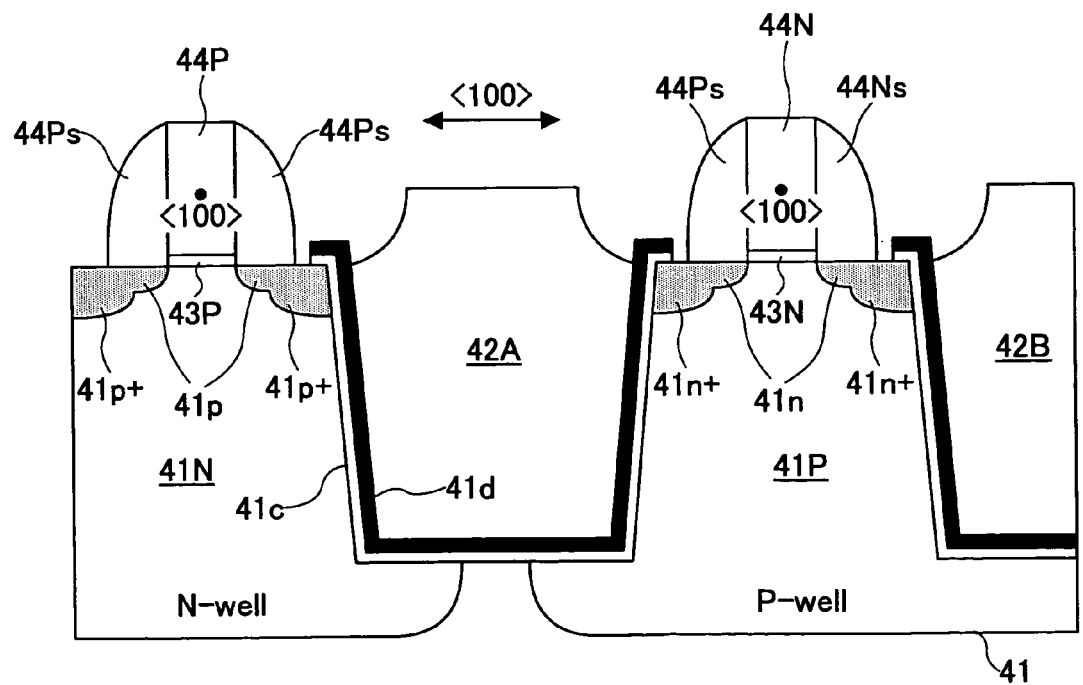

Further, in the step of FIG. 12I, B+ is introduced into the device region 41N under the acceleration voltage of 5 keV with the dose of $2\times10^{15}$ cm$^{-2}$ while using the gate electrode 44P and the sidewall insulation films 44Ps as a mask, and with this, deep diffusion regions 41p+ of p$^+$-type are formed as the source and drain regions of the p-channel MOS transistor at the respective outer sides of the sidewall insulation films 44Ps. Similarly, in the step of FIG. 12I, P+ is introduced into the device region 41P under the acceleration voltage of 10 keV with the dose of $2\times10^{15}$ cm$^{-2}$ while using the gate electrode 44N and the sidewall insulation films 44Ns as a mask, and with this, deep diffusion regions 41n+ of n$^+$-type are formed as the source and drain regions of the n-channel MOS transistor at the respective outer sides of the sidewall insulation films 44Ns.

In this step, too, the device region 41P is covered with the resist pattern not illustrated at the time of the ion implantation process to the device region 41N, while at the time of the ion implantation process to the device region 41P, the device region 41N is covered by a resist pattern not illustrated. Further, the device region 41N is covered by a resist pattern not illustrated at the time of the ion implantation process into the device region 41P. At the time of formation of the deep impurity region 41p+, the gate electrode 44P is doped to the p$^+$-type, while at the time of formation of the deep impurity region 41n+, the gate electrode 44N is doped to the n$^+$-type.

Further, in the step of FIG. 12J, a silicon nitride film 45 is formed on the structure of FIG. 12I by an LPCVD process with a thickness of 30-150 nm, preferably 50-100 nm, such that the silicon nitride film 45 covers the surface of the device isolation structures 42A and 42B, the gate electrode 44P carrying the sidewall insulation films 43Ps and further the gate electrode 44N carrying the sidewall insulation films 43Ns. Thereby, it should be noted that the silicon nitride film 45 can be formed to accumulate therein a strong tensile stress, by conducting the LPCVD process at the substrate temperature of 600° C. while using a mixed gas of SiCl$_2$H$_2$ and NH$_3$ as the source gas.

Conventionally, it was practiced in the art to form an etching stopper film on the surface of a silicon substrate by an SiN film such that the SiN film covers the gate electrode. In this case, a structure superficially resembling the structure of FIG. 12J including the SiN film 45 is obtained. However, in the case of forming the etching stopper film, a thickness of 20-30 nm is sufficient for the SiN film, and formation of the SiN film with the thickness exceeding 30 nm for avoiding the increase of stress is not practiced in the art.

With the present invention, which uses the SiN film 45 as the stressor film, the thickness of 30 nm for the SiN film 45 is not sufficient for achieving the desired effect of stress compensation, and thus, there is a need with the present invention to set the thickness of the SiN film to be 30 nm or more, preferably 50 nm or more.

On the other hand, from the viewpoint of difficulty of etching at the time of forming a contact hole with such a structure that includes a very large SiN film on the silicon substrate, it is preferable that the SiN film has a thickness not exceeding 150 nm, preferably not exceeding 100 nm.

With the construction of FIG. 12J, it becomes possible to obtain a semiconductor device having excellent characteristics for both p-channel and n-channel MOS transistors and immune to the change of device characteristics with the device size. By using such a semiconductor device thus compensated for the stress, the problem that the change of device characteristics with the device size is recognized as the variation of the device characteristics at the time of designing of the semiconductor is eliminated, and it becomes possible to design a semiconductor integrated circuit device including therein semiconductor devices of various sized while using a conventional circuit simulator.

Finally, in the step of FIG. 12K, an interlayer insulation film 46 of a silicon oxide film, or the like, is formed on the structure of FIG. 12J, and contact holes 46A are formed in the interlayer insulation film 46 so as to expose the deep diffusion regions 41p+ and 41n+. Further, the contact holes 46A are filled with a conductor such as polysilicon or tungsten, and there are formed contact plugs 46B for interconnection with the multilayer interconnection structure (not shown), which constitutes a part of the semiconductor integrated circuit device.

At the time of forming the contact holes 46A by a dry etching process with the structure of FIG. 12K that includes the silicon nitride film 45, the dry etching stops once upon exposure of the silicon nitride film 45. Thus, by further applying a dry etching process to the silicon nitride film 45 selectively, it becomes possible to form contact holes exposing the diffusion regions 41p+ or 41n+ without etching the edge part of the device isolation insulators 42A and 42B, and the problem of degradation of the device isolation performance of the device isolation structures 42A and 42B is avoided.

SECOND EMBODIMENT

Figure 13:
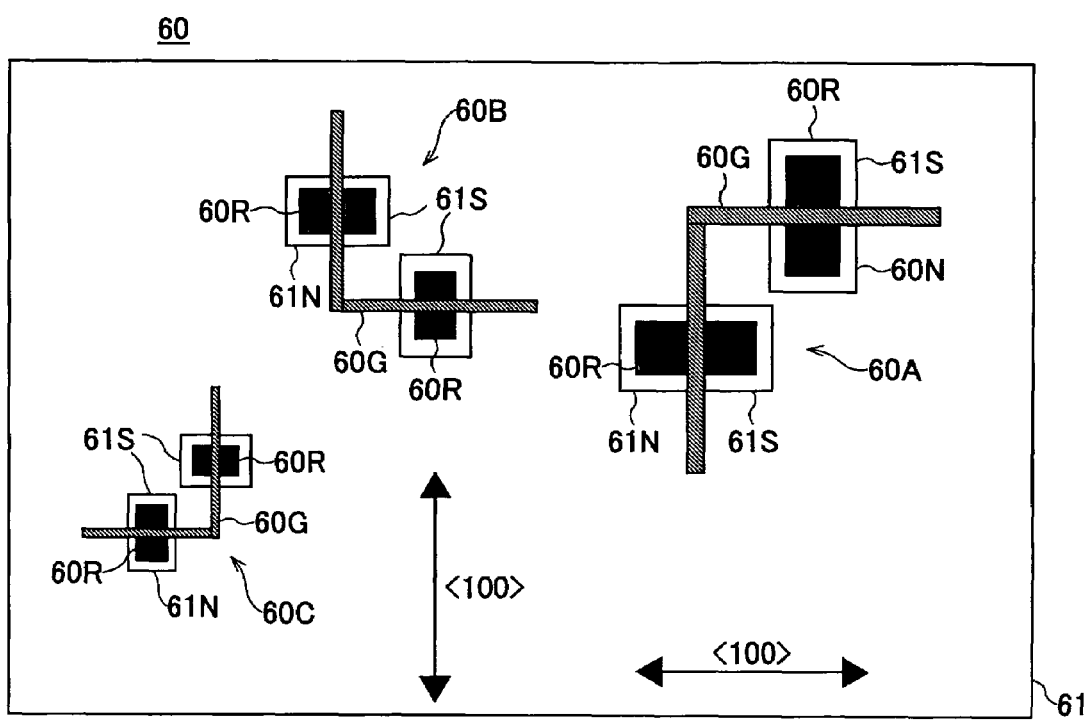
FIG. 13 is a diagram showing the construction of the semiconductor integrated circuit device according to a second embodiment of the present invention.

FIG. 13 shows the construction of a semiconductor integrated circuit device 60 formed on a silicon substrate according to a second embodiment of the present invention.

Referring to FIG. 13, the semiconductor integrated circuit device 60 includes semiconductor device elements 60A, 60B and 60C of different sizes.

In FIG. 13, each of the semiconductor device elements 60A-60C is formed in a device region 60R defined by a device isolation structure 61S of the STI structure and has a construction similar to that shown in FIG. 12K.

Further, each of the device isolation structures 61S includes a tensile stressor film 61N corresponding to the silicon nitride film 41d at the boundary to the device region 60R as a stress compensation film. Further, in each of the semiconductor device elements 60A-60C, it should be noted that the gate electrode 60G is formed so as to extend in the <100> direction, and with this, the carriers are transported through the channel region thereof in the <100> direction.

Further, while not illustrated, there is formed a silicon nitride film corresponding to the stressor film 45 on the silicon substrate 61 by a pyrolitic CVD process so as to compensate for the compressive stress caused by the silicon oxide film 61s together with the stressor film 61N.

Figure 14:
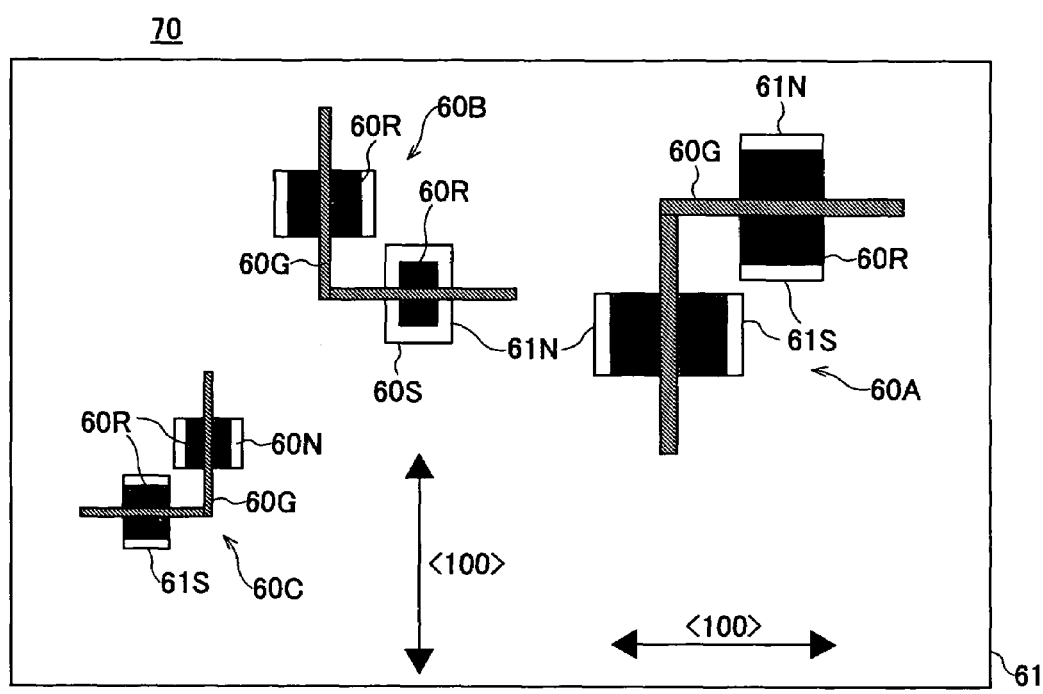
FIG. 14 is a diagram showing a modification for the semiconductor integrated circuit device of FIG. 13.

Thereby, because the degradation of carrier mobility is caused in the channel region of the n-channel MOS transistors by the stress that acts parallel to the direction in which the carriers are transported, it is possible to modify the construction of FIG. 13 as shown in FIG. 14, such that the stressor films 61N are formed only in the parts of the device region 60R aligned in the channel direction. Here, it should be noted that FIG. 14 is a plan view diagram showing the construction of the semiconductor integrated circuit device 70 according to a modification of FIG. 13. Thus, those parts corresponding to the parts described previously are designated by the same reference numerals and the description thereof will be omitted.

According to the present invention, it becomes possible to substantially eliminate the dependence of operational characteristics on the compressive stress for the p-channel MOS transistors, by setting the gate electrode orientation in the <100> direction. Further, according to the present invention, it becomes possible to substantially eliminate the dependence of operational characteristics upon the compressive stress for n-channel MOS transistors, by forming the first and second stressor films respectively on the surface of the silicon substrate and the surface of the device isolation trench of the STI (shallow trench isolation) structure.

According to the present invention, it becomes possible to eliminate the effect of the compressive stress, caused by the device isolation structure, upon the operational characteristics of the device substantially for any of the p-channel MOS transistors and the n-channel MOS transistors, and the variation of the device characteristics induced by the difference of the device area is successfully eliminated in the semiconductor integrated circuit device, in which a large number of semiconductor elements of different device areas are integrated on a silicon substrate. Thereby, it becomes possible to carry out the designing of the semiconductor integrated circuit by using a circuit simulator, even in the case the individual semiconductor elements in the semiconductor integrated circuit device are miniaturized.

Further, the present invention is not limited to the embodiments described heretofore, but various variations and modifications may be made without departing from the scope of the invention.

What is claimed is:

1. A semiconductor device comprising:
    a silicon substrate of a (100) surface orientation;
    a device isolation structure formed in said silicon substrate to define a first device region and a second device region in said silicon substrate;
    a n-channel MOS transistor formed in said first device region of said silicon substrate; and
    a p-channel MOS transistor formed in said second device region of said silicon substrate,
    said n-channel MOS transistor comprising a first gate electrode extending over said silicon substrate via a first gate insulation film in said first device region in a <100> direction of said silicon substrate and a pair of n-type diffusion regions formed in said silicon substrate in said first region at respective lateral sides of said first gate electrode,
    said p-channel MOS transistor comprising a second gate electrode extending over said silicon substrate via a second gate insulation film in said second device region in a <100> direction of said silicon substrate and a pair of p-type diffusion regions formed in said silicon substrate in said second region at respective lateral sides of said second gate electrode,
    a first stressor film accumulating therein a tensile stress being formed over said silicon substrate to cover at least said device isolation structure,
    said device isolation structure comprising a device isolation trench formed in said silicon substrate and a device isolation insulator filling said device isolation trench,
    a second stressor film accumulating therein a tensile stress being formed over a surface of said device isolation trench such that said second stressor film is interposed between said silicon substrate and said device isolation insulator,
    said first stressor film covering said first device region and said second device region continuously.

2. The semiconductor device according to claim 1, wherein a distance between an edge of said second gate electrode and an edge of said device isolation trench facing said edge of said second gate electrode is 1 μm or less in said p-channel MOS transistor, and wherein a distance between an edge of said first gate electrode and an edge of said device isolation trench facing said edge of said first gate electrode is 1 μm or less in said n-channel MOS transistor.

3. The semiconductor device according to claim 1, wherein said first and second stressor films contain silicon and nitride.

4. The semiconductor device according to claim 1, wherein there is provided a thermal oxide film between said second stressor film and said silicon substrate.

5. The semiconductor device according to claim 1, wherein said first stressor film covers said first gate electrode including sidewall insulation films thereof in said first region and said second gate electrode including sidewall insulation films thereof in said second region.

6. The semiconductor device according to claim 1, wherein said first stressor film has a thickness of 50-150 nm.

7. The semiconductor device according to claim 1, wherein said first stressor film has an increased film thickness on said device isolation film.

8. The semiconductor device according to claim 1, wherein said device isolation trench has a width of 100-400 nm.

9. A semiconductor device comprising a silicon substrate having a (100) surface orientation, and plural semiconductor elements formed over said silicon substrate,
   said plurality of semiconductor elements comprising plural p-channel MOS transistors and plural n-channel MOS transistors,
   said plural p-channel MOS transistors being formed in respective device regions formed in said silicon substrate by a device isolation structure with respective, mutually different areas, each of said plural p-channel MOS transistors comprising a gate electrode extending in a <100> direction of said silicon substrate and a pair of p-type diffusion regions formed in said device region of said p-channel MOS transistor at respective lateral sides of said gate electrode of said p-channel MOS transistor,
   said plural n-channel MOS transistors being formed in respective device regions formed in said silicon substrate by said device isolation structure with respective, mutually different areas, each of said plural n-channel MOS transistors comprising a gate electrode extending in a <100> direction of said silicon substrate and a pair of p-type diffusion regions formed in said device region of said n-channel MOS transistor at respective lateral sides of said gate electrode of said n-channel MOS transistor,
   each of said plural p-channel MOS transistors and n-channel MOS transistors being covered by a first stressor film accumulating therein a tensile stress,
   said device isolation structure comprising a device isolation trench formed in said silicon substrate so as to surround said device regions of said p-channel MOS transistors and said device regions of said n-channel MOS transistors, and a device isolation insulator filing said device isolation trench,
   a second stressor film accumulating therein a tensile stress being formed on a surface of said device isolation trench between said device isolation insulator and said silicon substrate,
   said first stressor film covering said first device region and said second device region continuously.

10. A semiconductor device comprising:
   a silicon substrate of a (100) surface orientation;
   a device isolation structure formed in said silicon substrate to define a first device region and a second device region in said silicon substrate;
   an n-channel MOS transistor formed in said first device region of said silicon substrate; and
   a p-channel MOS transistor formed in said second device region of said silicon substrate,
   said n-channel MOS transistor comprising a first gate electrode extending over said silicon substrate via a first gate insulation film in said first device region in a <100> direction of silicon substrate and a pair of n-type diffusion regions formed in said silicon substrate in said first region at respective lateral sides of said first gate electrode,
   said p-channel MOS transistor comprising a second gate electrode extending over said silicon substrate via aa second gate insulation film in said second device region in a <100> direction of said silicon substrate and a pair of p-type diffusion regions formed in said silicon substrate in said second region at respective lateral sides of said second gate electrode,
   a first stressor film accumulating therein a tensile stress being formed over said silicon substrate to cover at least said device isolation structure,
   said device isolation structure comprising a device isolation trench formed in said silicon substrate and a device isolation insulator filling said device isolation trench,
   a second stressor film accumulating therein a tensile stress being formed over a surface of said device isolation trench such that said second stressor film is interposed between said silicon substrate and said device isolation insulator,
   said first stressor film formed over said first device region and said second device region simultaneously.

11. A semiconductor device comprising a silicon substrate having a (100) surface orientation, and plural semiconductor elements formed over said silicon substrate,
   said plurality of semiconductor elements comprising plural p-channel MOS transistors and plural n-channel MOS transistors,
   said plural p-channel MOS transistors being formed in respective device regions formed in said silicon substrate by a device isolation structure with respective, mutually different areas, each of said plural p-channel MOS transistors comprising a gate electrode extending in a <100> direction of said silicon substrate and a pair of p-type diffusion regions formed in said device region of said p-channel MOS transistor at respective lateral sides of said gate electrode of said p-channel MOS transistor,
   said plural n-channel MOS transistors being formed in respective device regions formed in said silicon substrate by said device isolation structure with respective, mutually different areas, each of said plural n-channel MOS transistors comprising a gate electrode extending in a <100> direction of said silicon substrate and a pair of p-type diffusion regions formed in said device region of said n-channel MOS transistor at respective lateral sides of said gate electrode of said n-channel MOS transistor,
   each of said plural p-channel MOS transistors and n-channel MOS transistors being covered by a first stressor film accumulating therein a tensile stress,
   said device isolation structure comprising a device isolation trench formed in said silicon substrate so as to surround said device regions of said p-channel MOS transistors and said device regions of said n-channel MOS transistors, and a device isolation insulator filing said device isolation trench,
   a second stressor film accumulating therein a tensile stress being formed on a surface of said device isolation trench between said device isolation insulator and said silicon substrate,
   said first stressor film formed over said first device region and said second device region simultaneously.

* * * * *